United States Patent [19]

Kato et al.

[11] Patent Number: 5,051,338

[45] Date of Patent: * Sep. 24, 1991

[54] METHOD AND APPARATUS FOR FORMING RESIST PATTERN

[75] Inventors: Yoshihide Kato, Kawasaki; Kei Kirita, Tokyo; Toshiaki Shinozaki, Yokohama; Fumiaki Shigemitsu, Yokohama; Kinya Usuda, Yokohama; Takashi Tsuchiya, Urawa, all of Japan

[73] Assignee: Tokyo Shibaura Denki Kabushiki Kaisha, Kawasaki, Japan

[*] Notice: The portion of the term of this patent subsequent to Jan. 5, 2005 has been disclaimed.

[21] Appl. No.: 441,479

[22] Filed: Nov. 27, 1989

Related U.S. Application Data

[63] Continuation of Ser. No. 108,767, Oct. 15, 1987, Pat. No. 4,897,337, which is a continuation of Ser. No. 789,366, Oct. 22, 1985, Pat. No. 4,717,645, which is a continuation of Ser. No. 571,092, Jan. 16, 1984, abandoned.

[30] Foreign Application Priority Data

Jan. 19, 1983 [JP] Japan ................................. 58-5876
Jan. 19, 1983 [JP] Japan ................................. 58-5877
Jan. 19, 1983 [JP] Japan ................................. 58-6984
Jan. 19, 1983 [JP] Japan ................................. 58-6985

[51] Int. Cl.$^5$ ................................................. G03C 5/16
[52] U.S. Cl. ........................................ 430/296; 430/325; 430/326; 430/327; 430/330
[58] Field of Search ............... 430/327, 330, 296, 325, 430/326

[56] References Cited

U.S. PATENT DOCUMENTS 4,717,645 1/1988 Kato et al. .......................... 430/296

Primary Examiner—Charles L. Bowers, Jr.
Assistant Examiner—Thorl Chea
Attorney, Agent, or Firm—Oblon, Spivak, McClelland, Maier & Neustadt

[57] ABSTRACT

A method for forming a highly precise resist pattern with good reproducibility has the steps of: applying a resist material to a substrate to form a resist film; baking the resist film; cooling the resist film in a controlled manner; selectively irradiating the resist film with one of electromagnetic waves in a predetermined wavelength range and particle beam having predetermined energy; and developing the resist film to form a resist pattern.

6 Claims, 7 Drawing Sheets

METHOD AND APPARATUS FOR FORMING RESIST PATTERN

This invention is a continuation of Ser. No. 108,767, filed Oct. 15, 1987, now U.S. Pat. No. 4,894,337, which is a continuation of Ser. No. 789,366, filed Oct. 22, 1985, now U.S. Pat. No. 4,717,645, which is a continuation of application Ser. No. 571,092, filed Jan. 16, 1984, now abandoned.

BACKGROUND OF THE INVENTION

The present invention relates to a method and apparatus for forming a resist pattern.

As semiconductor element integration has increased along with research and development of a VLSI (Very Large Scale Integration), there has arisen a demand for a resist micropattern formation technique with high precision. For this reason, allowable dimensional precision has become stricter. In the most advanced technique, for example, a precision of $3\sigma \leq 0.1$ μm (where $\sigma$ is the standard deviation with respect to the average size of the wafer) is required in a 6" mask substrate or 5" wafer. Furthermore, in order to use the resist pattern in a mass production line, a dimensional variation in the resist pattern between the mask substrates or wafers must be smaller than $3\sigma \leq 0.15$ μm. A highly sensitive resist pattern is required to improve the mass production effect. The sensitivity of the resist pattern must also be controlled to be suitable for an exposure apparatus (energy rays irradiating apparatus).

FIG. 1 shows a block diagram of a conventional resist pattern formation process. A resist material is applied on a starting substrate such as a mask substrate by a spin coating method. The resist film on the substrate is heated by a heating means such as an oven or a heating plate to a predetermined temperature (Tb) in accordance with the type of resist. In other words, so-called prebaking is performed. After prebaking is performed for a predetermined period of time, the substrate having the resist film thereon is vertically supported on a support and is naturally cooled to room temperature for about 20 to 30 minutes. Electromagnetic waves within a predetermined wavelength range such as ultraviolet rays; or particle beam such as electron beam having predetermined energy selectively are irradiated on the substrate for exposure. Thereafter, predetermined development and rinsing are performed to form a desired resist pattern.

However, according to the conventional resist pattern formation method described above, the sensitivity of the resist film on the substrate becomes nonuniform, so that it is very difficult to obtain a resist pattern with high precision. In this manner, since adjustment of the sensitivity of the resist pattern is difficult, the resist can be used only in limited conditions. As a result, the resist patterns cannot be formed under proper conditions.

The present inventors have made extensive studies on the dimensional precision of the resist pattern obtained by the conventional method. As a result of such studies, we found that since the substrate having the resist film is naturally cooled after prebaking while it is vertically supported on the support, a thermal hysteresis of the resist film is nonuniform, and that the dimensional variation of the resist film is caused by the nonuniform thermal hysteresis.

A temperature profile of the entire area of the resist film during natural cooling while it was vertically supported on the support was measured by an infrared radiation thermometer. The test results are shown in FIG. 2. Referring to FIG. 2, reference symbols $T_1$, $T_2$ and $T_3$ denote isotherms on the surface of a substrate 1 where $T_1 > T_2 > T_3$. As is apparent from FIG. 2, a temperature of the lower portion of the substrate 1 is lower than that of the upper portion thereof. This temperature profile changes as a function of time. Changes in temperatures at points A, B and C of the upper, central and lower portions of the substrate 1 are measured, and the results are shown in a graph of FIG. 3. In the graph shown in FIG. 3, curve A indicates temperature at point A; curve B indicates temperature at point B; and curve C indicates temperature at point C. As is apparent from the graph of FIG. 3, the upper portion of the substrate 1 takes longer time to cool than does the lower portion thereof. A maximum difference between the temperatures at points A and B was about 15° C.; and a maximum difference between the temperatures at points A and C was about 30° C. This temperature profile results from the fact that the substrate is vertically supported on the support and natural convection from the lower portion to the upper portion of the substrate 1 tends to occur and heat is quickly dissipated from the lower portion of the substrate as compared with the heat dissipation at the upper portion thereof.

The resist film on the substrate 1 which was subjected to natural cooling was exposed and developed to form a resist pattern. The size of the resist pattern was precisely measured. The resist pattern size was found to have a close correlation with the temperature profile or cooling curve. The size at points A, B and C were 2.0 μm, 1.9 μm and 1.8 μm, respectively. The sensitivities at points A and B of the resist film were measured, and the results are shown in FIG. 4. Curve A' is the sensitivity at point A; and curve C' is sensitivity at point C. As is apparent from the graph of FIG. 4, the temperature profile or cooling curve during natural cooling has the close correlation with the sensitivity of the resist film. This correlation results in dimensional variation.

As described above, according to the conventional technique, cooling process of the resist film after prebaking is not properly controlled, so the sensitivity of the resist film locally varies in accordance with cooling conditions. As a result, it is difficult to form the resist pattern with high precision.

SUMMARY OF THE INVENTION

It is a principal object of the present invention to provide a method for forming a highly precise resist pattern with good reproducibility.

It is another object of the present invention to provide an apparatus for performing the above method.

A method for forming a resist pattern according to the present invention comprises the steps of: applying a resist material to a substrate to form a resist film thereon; baking said resist film; cooling said resist film in a controlled manner; selectively irradiating said resist film with one of electromagnetic waves in a predetermined wavelength range and particle beam having predetermined energy; and developing said resist film to form a resist pattern.

The step of cooling the resist film in the controlled manner can be performed by one of the following processes:

(1) Cooling is performed while a temperature of the resist film is controlled. This cooling process allows the resist film to have a desired sensitivity. Furthermore, the sensitivity of the resist suitable for an exposure apparatus or any other process can be selected in a wide range.

(2) Cooling is performed while the thermal hysteresis of the resist film is controlled to be uniform and the same for each of resist films. With this cooling process, the entire surface of a resist film has a uniform sensitivity, and the same uniform sensitivity is obtained for each resist film.

(3) Cooling is performed while the entire surface of the resist film is kept at a uniform temperature. With this cooling process, the sensitivity of the resist can become uniform over the entire surface of the resist film, thereby obtaining a highly precise resist pattern.

(4) Rapid cooling of the resist film is performed. By using this cooling process having a maximum cooling rate of 0.8° C./sec or higher, the sensitivity of the resist film can be dramatically improved. As a result, the exposure time can be shortened due to improvement of the sensitivity. Unlike the conventional lengthy cooling after prebaking, the time interval between the end of prebaking and the end of exposure can be greatly shortened. For example, 10 substrates can be conventionally processed within one hour whereas 300 substrates can be processed within one hour according to the present invention.

It is possible to change the sensitivity of the resist by changing the starting temperature of rapid cooling. When the rapid cooling is started from the baking temperature (Tb), the resist is enabled to exhibit the highest sensitivity, while the sensitivity is gradually reduced with lowering of the starting temperature of rapid cooling. The sensitivity is markedly changed when the rapid cooling is started from the glass transition temperature (Tg) or higher. If the starting temperature of rapid cooling is lower than Tg, the resist exhibits the lowest sensitivity, which is substantially equal to that obtained by natural cooling. In other words, the effect of rapid cooling is not successful when the rapid cooling is started from a temperature lower than Tg.

Controlled cooling according to the present invention is preferably started within about 5 minutes after baking is performed. When the substrate is vertically supported on the support and naturally cooled for over 5 minutes, the sensitivity of the resist film becomes nonuniform, then, the effect of the controlled cooling process cannot be obtained. The greatest effectiveness of the present invention can be obtained when the controlled cooling process is started immediately after the baking is completed.

Furthermore, the present inventors confirmed that the same effect as mentioned above is obtained by performing second baking of the resist film, preferably, at the glass transition temperature or higher, then followed by the controlled cooling process. They also confirmed that the effect is irrespective of the thermal hysteresis of the resist film before development process. In this case, cooling before the second baking may be natural cooling. Controlled cooling after the second baking also includes the four processes described above.

The substrate used in the present invention includes: a mask substrate; a wafer; and a wafer with any type of semiconductor film, an insulating film or a metal film formed thereon.

The resist material used in the present invention includes a photoresist material, a far-ultraviolet sensitive resist material, an electron beam sensitive resist material, an X-ray sensitive resist material, and an ion beam sensitive resist material.

The exposure method in the present invention can be performed by using electron beam, light rays, X-rays, or ion beams.

A typical cooling medium used for cooling the resist film can be one or both of a liquid and a gas which are not substantially dissolved or react with the resist material and have a large heat capacity. A typical example of the cooling liquid is water or liquid Fron at a predetermined temperature. A typical example of the cooling gas is nitrogen gas or Fron gas at a predetermined temperature.

DETAILED DESCRIPTION OF THE PREFERRED EMBODIMENT

The present invention will now be described by way of its examples.

EXAMPLE 1

Figure 1:
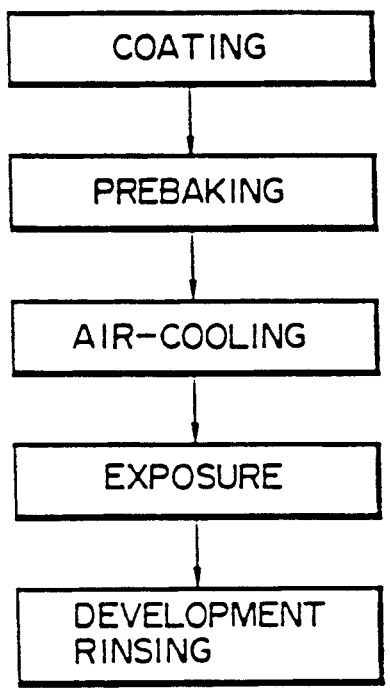
FIG. 1 is a block diagram showing a conventional process for forming a resist pattern.
Figure 2:
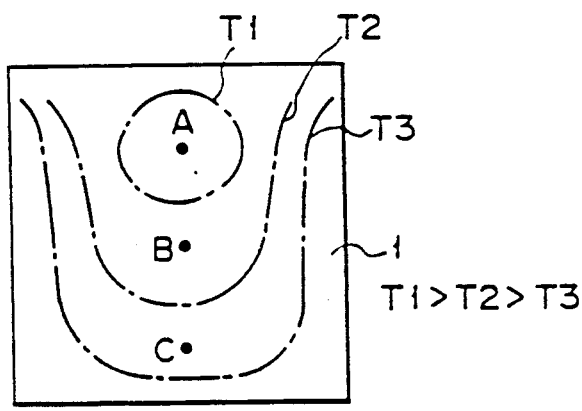
FIG. 2 is a graph showing a temperature profile in an air-cooling step of FIG. 1.
Figure 3:
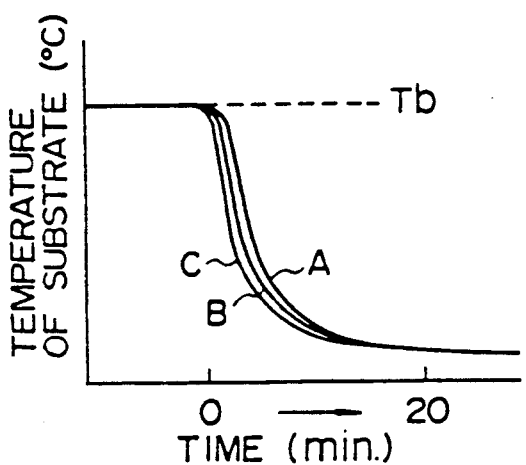
FIG. 3 is a graph showing a temperature change in a substrate in the air-cooling step of FIG. 1.
Figure 4:
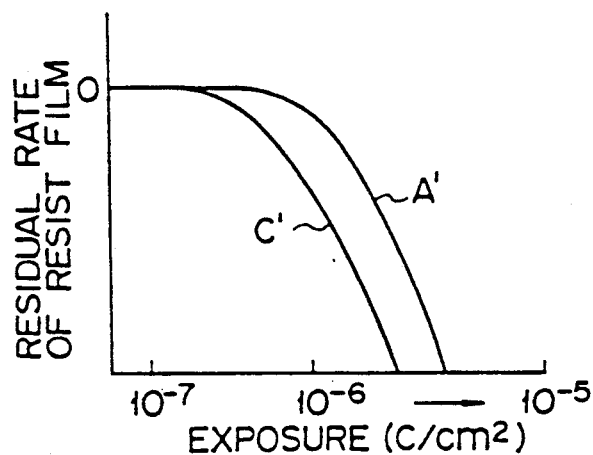
FIG. 4 is a graph showing the relationship between the exposure and the residual rate of the resist film at different portions of the resist film.
Figure 5:
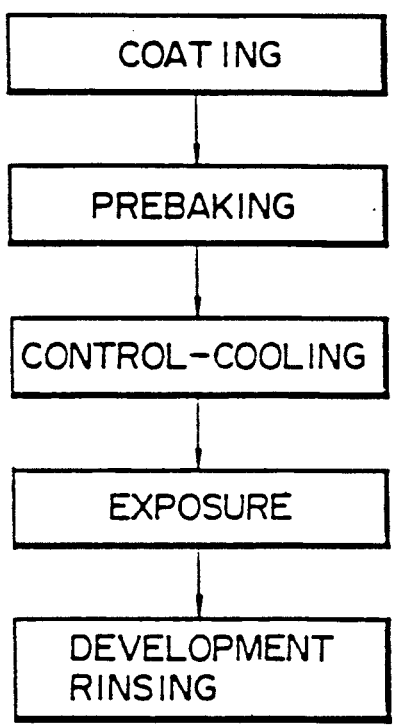
FIG. 5 is a block diagram showing a resist pattern formation process according to an embodiment of the present invention.
Figure 6:
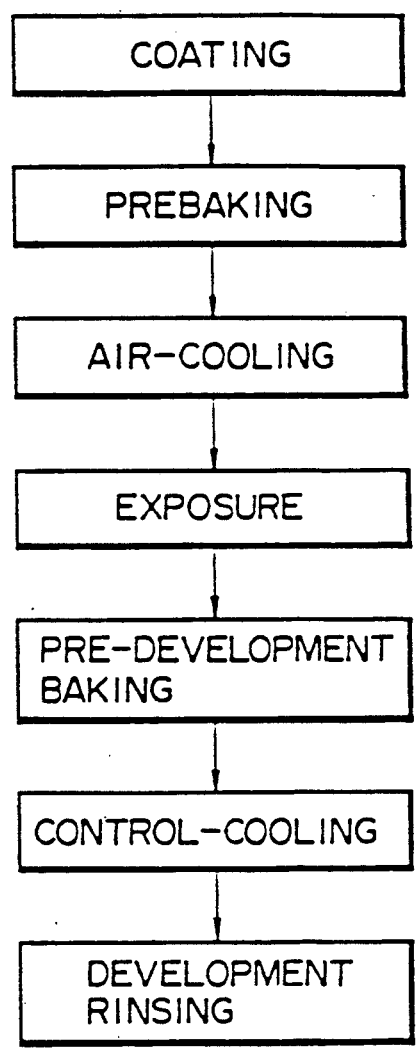
FIG. 6 is a block diagram showing a resist pattern formation process according to another embodiment of the present invention.
Figure 7:
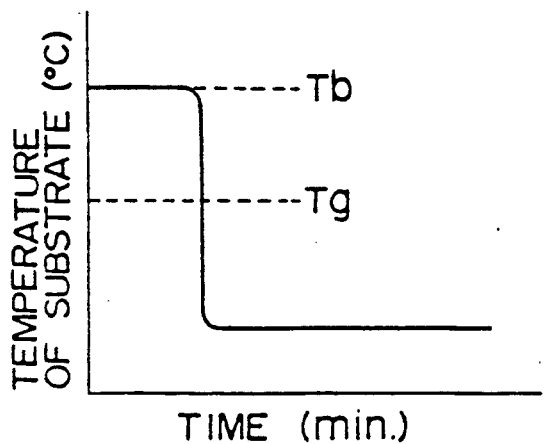
FIG. 7 is a graph showing a temperature change in a substrate in the cooling step of Example 1.

A resist material of poly-2,2,2-trifluoroethyl-α-chloroacrylate dissolved in a solvent was dripped through a nozzle on a glass substrate on which chromium was deposited and which was placed on a rotating carriage. The resist material was applied by a known spin coating method to form a resist film having a predetermined thickness. Thereafter, the glass substrate was placed in an oven to prebake the resist film at a temperature of 200° C. for 30 minutes. After prebaking was completed, the glass substrate was dipped in pure water (25° C.) in a water tank. In this case, water is preferably pressurized at a high pressure to prevent water bumping. As a result, the resist film on the surface of the glass substrate was cooled from a prebaking temperature Tb to a temperature of 25° C. through a glass transition temperature Tg. The cooling curves at points A, B and C (FIG. 2) of the substrate are given in a graph shown in FIG. 7. In other words, cooling can be uniformly and quickly performed over the entire area of the resist film. The temperature of the resist film was measured by bringing a thermocouple in contact with the resist film.

The glass substate having the resist film thereon was placed on the rotating carriage and was subjected to spin drying. Electron beam selectively irradiated the sufficiently dried resist film at an acceleration voltage of 20 kV. Thereafter, the exposed resist film was developed by a developer as a mixture of methyl isobutyl ketone and isopropyl alcohol in a ratio of 7:3 at a temperature of 25° C. for 10 minutes. Subsequently, the developed resist film was rinsed by isopropyl alcohol at a temperature of 25° C. for 30 seconds.

As a result, a highly precise resist pattern having a maximum size deviation of 0.1 μm was formed on the glass substrate. This is because the resist film was uniformly cooled after prebaking is completed. When polymethyl methacrylate was used as the resist material, a highly precise resist pattern having a maximum size deviation of 0.1 μm or less could be formed on the glass substrate.

EXAMPLES 2 TO 7

Figure 8:
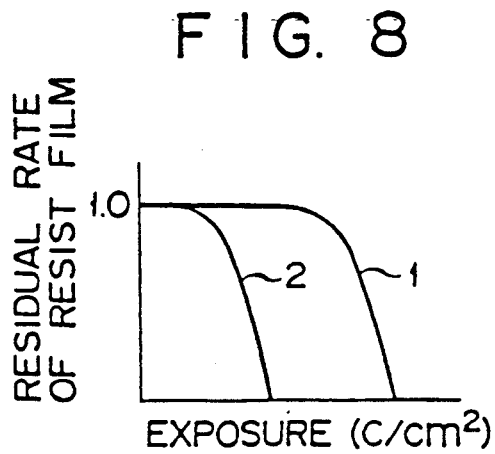
FIG. 8 is a graph showing sensitivity curves of Examples 2 to 7 of the present invention in comparison with that of Prior art example.

Resist patterns were formed in the same manner as in Example 1 except that the cooling manners are changed, and sensitivities thereof were measured. The results are shown in Table 1 below. In Examples 2 and 5, cooling was performed by immersing the samples in water of 25° C. In Examples 3, 4, 6 and 7, N gas of 25° C. was blown in different rates against the samples for the cooling purpose. In Prior arts 1 and 2, the samples were subjected to natural cooling under the air atmosphere of 25° C. Further, in Controls 1 and 2, the samples were subjected to natural cooling within the ovens in which the prebaking was performed. The sensitivities were determined in accordance with the sensitivity curves which indicated the relationships between the thicknesses of the residual resist films after exposure and development (FIG. 8). Curve 1 in the graph of FIG. 8 indicates the sensitivity curve of the prior art example; and curve 2 indicates the sensitivity curve of the present invention.

TABLE 1

| | Substrate | Resist | Tg(°C.) | Prebaking conditions | Maximum cooling rate (°C./sec) | Sensitivity (μc/cm$^2$) | Developing conditions | Developer |
|---|---|---|---|---|---|---|---|---|
| Example 2 | A | C | 133 | 200° C. × 30 min | 175 | 0.1 | 25° C. × 10 min | L |
| Example 3 | A | C | 133 | 200° C. × 30 min | 10 | 0.7 | 25° C. × 10 min | L |
| Example 4 | A | C | 133 | 200° C. × 30 min | 0.8 | 2 | 25° C. × 10 min | L |
| Prior art 1 | A | C | 133 | 200° C. × 30 min | 0.3 | 3 | 25° C. × 10 min | L |
| Control 1 | A | C | 133 | 200° C. × 30 min | 0.03 | 5 | 25° C. × 10 min | L |
| Example 5 | B | D | 110 | 170° C. × 60 min | 145 | 2 | 25° C. × 13 min | M |
| Example 6 | B | D | 110 | 170° C. × 60 min | 10 | 3 | 25° C. × 13 min | M |
| Example 7 | B | D | 110 | 170° C. × 60 min | 0.8 | 5.5 | 25° C. × 13 min | M |
| Prior art 2 | B | D | 110 | 170° C. × 60 min | 0.3 | 7 | 25° C. × 13 min | M |
| Control 2 | B | D | 110 | 170° C. × 60 min | 0.03 | 8 | 25° C. × 13 min | M |

A: chromium-deposited glass substrate;
B: silicon wafer;
C: poly-2,2,2-trifluoroethyl-α-chloroacrylate;
D: polymethyl methacrylate;
L: methyl isobutyl ketone:isopropyl alcohol = 7:3;
M: methyl isobutyl ketone
(The rinsing treatment was performed with isopropyl alcohol at 25° C. for 30 seconds.)

According to the method of Examples 2 to 6 wherein the resist film was rapidly cooled after prebaking, with reference to Table 1, the sensitivity of the resist film is found to be dramatically improved as compared with the conventional method.

Figure 9:
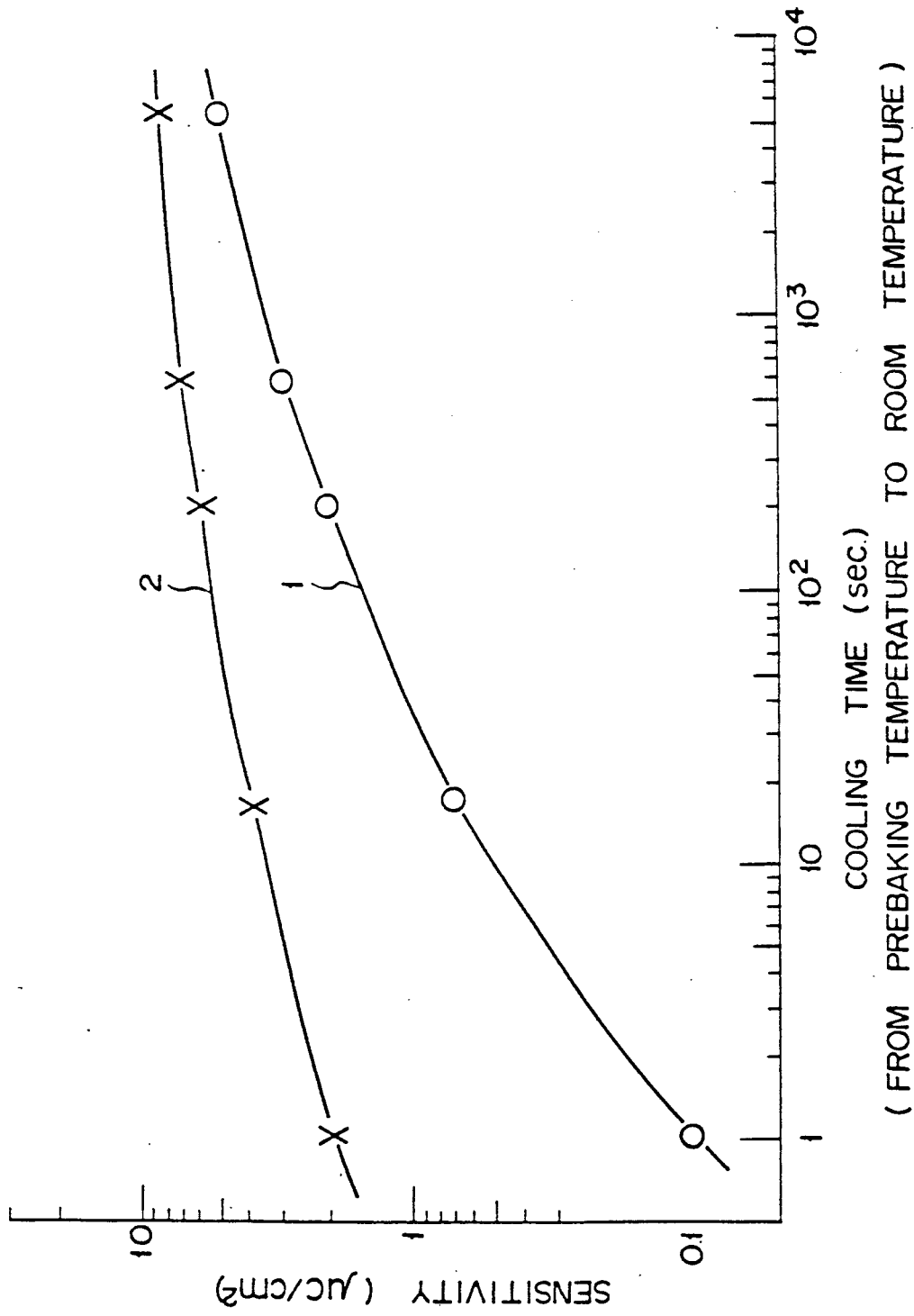
FIG. 9 is a graph showing the relationship between the cooling time and sensitivity of Examples 2 to 6.

FIG. 9 is a graph showing changes in sentivity of the resist film when the cooling rate of the resist film is changed in accordance with the data obtained in Table 1. Referring to FIG. 9, curve 1 is obtained when resist C is used; and curve 2 is obtained when resist D is used. As is apparent from FIG. 9, when the resist film is cooled at a maximum cooling rate of 0.8° C./sec or more, the sensitivity of the resist film can be greatly improved as compared with those of Prior art and Comparative Examples. In particular, when the cooling rate exceeds 10° C./sec, the sensitivity can be improved by several times as compared with those of the Prior art and Comparative Examples.

Figure 10:
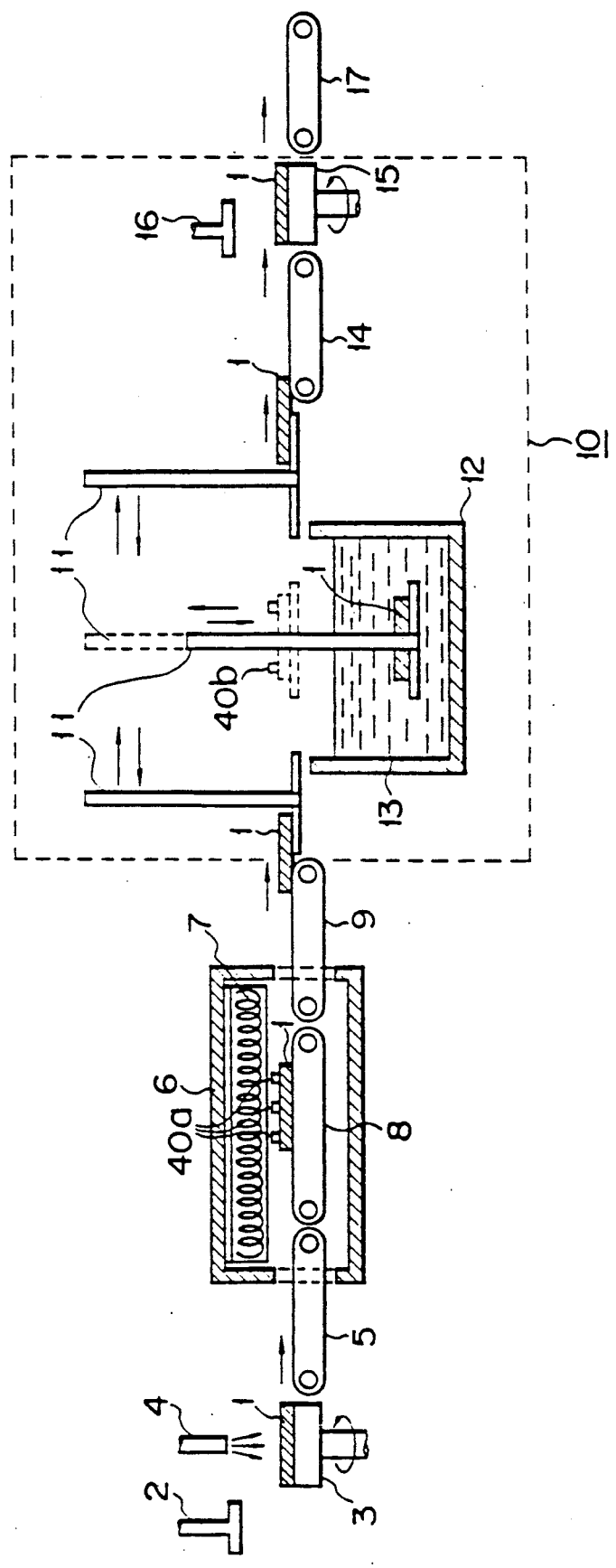
FIG. 10 is a schematic view showing a resist pattern forming apparatus used in Examples 1 to 6 of the present invention.

An apparatus for performing Examples 1 to 6 will be described with reference to FIG. 10. The apparatus shown in FIG. 10 is an automatic apparatus for performing from the step of coating the resist material to the substrate surface to the step immediately before exposure step.

A substrate 1 to be coated with the resist material is loaded by a vacuum chuck 2 on a rotating carriage 3. The resist material dissolved in a solvent is dripped through a nozzle 4 on the surface of the rotating substrate 1. As a result, a resist film is formed on the surface of the substrate 1. The substrate 1 is then transferred by the vacuum chuck 2 to a belt conveyor 5 and is conveyed by the belt conveyor 5 into an oven 6. A heater 7 is disposed in the oven 6. A low-speed belt conveyor 8 is disposed under the heater 7 to convey the substrate 1.

The substrate 1 conveyed by the belt conveyor 5 into the oven 6 is transferred to the belt conveyor 8 within the oven 6. The substrate 1 is slowly fed within the oven 6. During feeding, the substrate 1 is prebaked by the heater 7 at a predetermined temperature for a predetermined period of time. When prebaking is completed, the substrate 1 is transferred to a belt conveyor 9 and is conveyed to a cooling mechanism 10.

The substrate 1 is transferred from the belt conveyor 9 to a conveyor mechanism 11 which can be moved in all directions. The substrate 1 is dipped by the conveyor mechanism 11 in pure water 13 as a liquid coolant stored in a cooling vessel 12, and is cooled. The cooled substrate 1 is removed by the conveyor mechanism 11 from the pure water 13 and is transferred to a belt conveyor 14. The substrate 1 is loaded by the belt convetor 14 on a rotating carriage 15 and is subjected to spin drying. The dried substrate 1 is moved by a vacuum chuck 16 to a belt conveyor 17 and is unloaded. The resist film thus formed on the surface of the substrate 1 will be subjected to predetermined exposure, development and rinsing processes, thereby obtaining a resist pattern. Referring to FIG. 10, reference numerals 40a and 40b respectively denote thermocouples for measuring the temperature of the resist film. Infrared radiation thermometers may be used in place of these thermocouples.

The cooling mechanism is not limited to the immersion type cooling mechanism 10 shown in FIG. 10. For example, a spraying type, shower type or cooling plate type cooling mechanism can be used.

Figure 11:
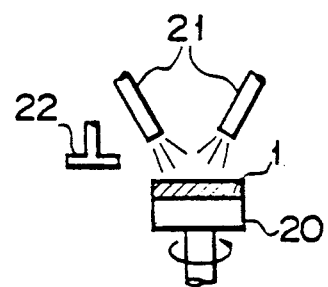
FIGS. 11 to 13 are schematic diagrams showing various cooling means used in the apparatus of FIG. 10, respectively.

FIG. 11 shows a spraying type cooling mechanism. In this cooling mechanism, a liquid or gas coolant is sprayed from a nozzle 21 disposed above a substrate 1 onto the rotating substrate 1 loaded on a rotating carriage 20. The cooled substrate 1 is unloaded from a vacuum chuck 22. When a gas is used as the coolant, a reduced pressure atmosphere is preferably used to achieve uniform cooling conditions.

Figure 12:
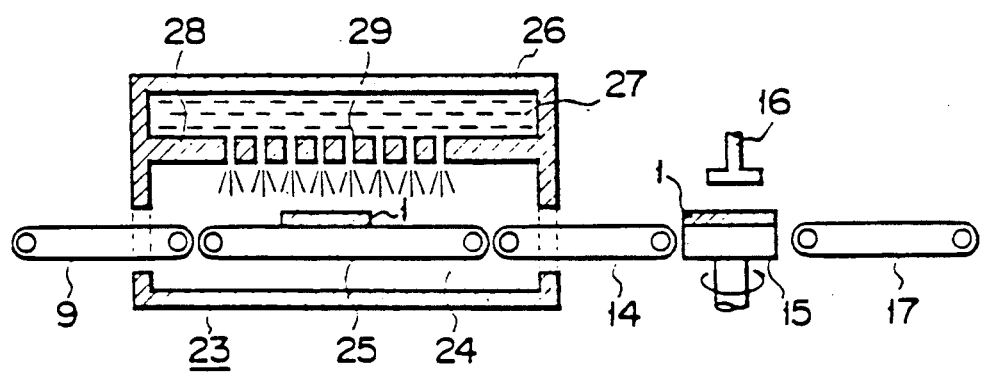

FIG. 12 shows a shower type cooling mechanism. In this cooling mechanism, a substrate 1 conveyed by a belt conveyor 9 is moved to a belt conveyor 25 disposed in a cooling chamber 24 of a shower type cooling apparatus 23. A coolant 27 stored in a liquid coolant chamber 26 is sprayed onto the resist film formed on the surface of the substrate 1 through a perforated plate 29 disposed in a barrier 28 partitioning a coolant chamber 26 and a cooling chamber 24. The cooled substrate 1 is transferred to a belt conveyor 14 and is loaded by a vacuum chuck 16 on a rotating carriage 15 and is dried while the substrate 1 is rotated. Thereafter, the dried substrate 1 is transferred by the vacuum chuck 16 to a belt conveyor 17 and is unloaded by the belt conveyor 17. A gas coolant can be used in place of the liquid coolant. In this case, the drying step can be omitted, and the rotating carriage 15 can therefore be omitted.

Figure 13:
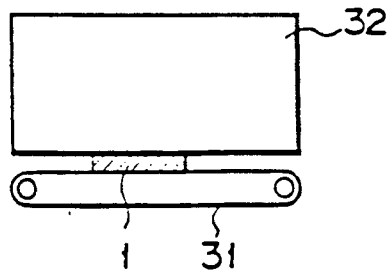

FIG. 13 shows a cooling plate type cooling mechanism. In this cooling mechanism, a substrate 1 is uniformly cooled by a cooling plate 32 disposed in the vicinity of the substrate 1 while the substrate 1 is fed along a belt conveyor 31. However, the belt conveyor 31 may be held stationary, and the cooling plate 32 may be brought into contact with the substrate 1 to cool the substrate 1.

As a simple uniform cooling process, the substrate 1 (FIG. 10) having the resist film thereon and placed on the conveyor mechanism 11 need not be placed in the cooling chamber 12 but may be positioned above the cooling chamber as indicated by the broken line to cool the substrate 1 in air. In this case, unlike the conventional cooling method wherein the substrate is vertically supported on the support, convection from the lower position to the upper position will not occur, so that the temperature profile of the resist film becomes uniform. Furthermore, when a clean air flow having a given temperature profile is used, a better cooling effect can be obtained.

EXAMPLE 8

A resist material of poly-2,2,2-trifluoroethyl-α-chloroacrylate dissolved in a solvent was dripped through a nozzle on a glass substrate on which chromium was deposited and which was placed on a rotating carriage. The resist material was applied by a known spin coating method to form a resist film having a predetermined thickness. Thereafter, the glass substrate was placed in an oven to prebake the resist film at a temperature of 200° C. for 30 minutes. After prebaking was completed, the glass substrate was vertically supported on a support and was naturally cooled to room temperature for 30 minutes. Electron beam selectively irradiated the sufficiently dried resist film at an acceleration voltage of 20 kV. Thereafter the glass substrate was placed in an oven to bake the resist film at a temperature of 200° C. for 30 minutes. After baking was completed, the glass substrate was dipped in pure water (25° C.) in a water tank. As a result, the resist film on the surface of the glass substrate was cooled from a baking temperature Tb to a temperature of 25° C. through a glass transition temperature Tg. The cooling curves at points A, B and C (FIG. 2) of the substrate are given in a graph shown in FIG. 7. In other words, cooling can be uniformly and quickly performed over the entire area of the resist film. The temperature of the resist film was measured by bringing a thermocouple in contact with the resist film.

The glass substate having the resist film thereon was placed on the rotating carriage and was subjected to spin drying. Thereafter, the exposed resist film was developed by a developer as a mixture of methyl isobutyl ketone and isopropyl alcohol in a ratio of 7:3 at a temperature of 25° C. for 10 minutes. Subsequently, the developed resist film was rinsed by isopropyl alcohol at a temperature of 25° C. for 30 seconds.

As a result, a highly precise resist pattern having a maximum size deviation of 0.1 $\mu$m was formed on the glass substrate. This is because the resist film was uniformly cooled after prebaking is completed. When polymethyl methacrylate was used as the resist material, a highly precise resist pattern having a maximum size deviation of 0.1 $\mu$m or less could be formed on the glass substrate.

EXAMPLE 9

Figure 14:
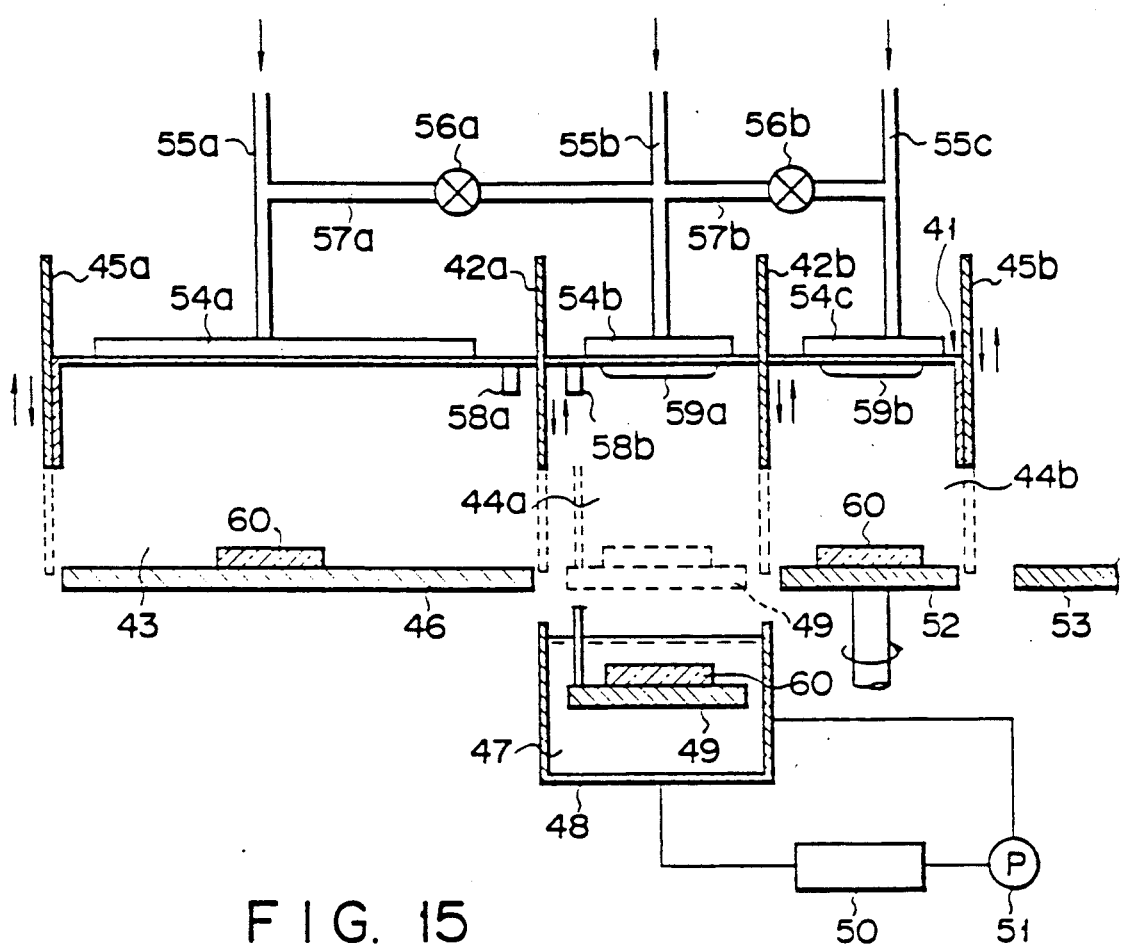
FIG. 14 is a schematic diagram showing a baking-cooling device used in Examples 7 to 9 of the present invention.

FIG. 14 is a schematic view showing a prebaking-cooling mechanism of the resist pattern forming apparatus according to the present invention. Reference numeral 41 denotes a chamber whose bottom surface and parts of right and left side walls are opened. The chamber 41 is partitioned by first and second internal shutters 42a and 42b into a prebaking chamber 43, a first cooling chamber 44a and a second cooling chamber 44b from the left side (inlet port side). An inlet port external shutter 45a is disposed at the inlet port of the prebacking chamber 43 to be vertically movable. An outlet port external shutter 45b is disposed at the outlet port of the second cooling chamber 44b to be vertically movable. A hot plate 46 is disposed at the bottom of the prebaking chamber 43. A cooling vessel 48 is disposed below the level of the hot plate 46 of the first cooling chamber 44a and stores, for example, cooling water 47. A support 49 is disposed at the bottom surface of the first cooling chamber 44a and is vertically movable to be dipped in the cooling water 47 in the cooling vessel 48. One terminal of a temperature controller 50 is coupled to the cooling vessel 48, and the other terminal thereof is also connected to the cooling vessel 48 through a pump 51 for circulating the cooling water 47. A rotatable vacuum chuck 52 is disposed at the same level as that of the hot plate 46 at the bottom surface of the second cooling chamber 44b. A conveyor carriage 53 is disposed at the outlet port of the second cooling chamber 44b to convey the substrate to an exposure mechanism (not shown).

First, second and third warm air feeders 54a, 54b and 54c are disposed in the upper walls of the prebaking chamber 43, the first cooling chamber 44a and the second cooling chamber 44b, respectively. First, second and third warm air feed pipes 55a to 55c for feeding nitrogen gas are connected to the warm air feeders 54a to 54c, respectively. The first and second warm air feed pipes 55a and 55b are connected to each other through a pipe 57a via a valve 56a. The second and third warm air feed pipes 55b and 55c are connected to each other through a pipe 57b via a valve 56b. Furthermore, temperature sensors 58a and 58b are arranged on the ceiling portions of the prebaking chamber 43 and the first cooling chamber 44a which are in the vicinity of the first inner shutter 42a, respectively. The temperature sensors 58a and 58b detect a prebaking temperature and control the flow rate of the air fed through the first warm air feed pipe 55a and the temperature of the hot plate 46 through a controller (not shown). Temperature sensors 59a and 59b are arranged on the ceilings of the first and second cooling chambers 44a and 44b to detect the temperatures thereof, respectively. The temperature sensors 59a and 59b detect the temperatures of the cooling chambers 44a and 44b, respectively, and control the temperatures of the warm air fed through the second and third warm air feed pipes 55b and 55c through a controller (not shown). A conveyor member (not shown) for conveying the substrate (with the resist film coated thereon by a coating mechanism (not shown)) to the prebaking chamber 43 is disposed outside the inlet port of the prebaking chamber 43.

A method for forming a resist pattern will be described with reference to the operation of the prebaking-cooling mechanism of FIG. 14.

The inlet port external shutter 45a and the first internal shutter 42a were opened, and the second internal shutter 42b and the outlet port external shutter 45b were closed. A mask substrate 60 applied with a resist material by a resist coating mechanism (not shown) was conveyed in the prebaking chamber 43 through the inlet port of the opened chamber 41 and was set on the hot plate 46. The resist film on the mask substrate 60 was prebaked by the hot plate 46 at a predetermined temperature for a predetermined period of time. At this time, the temperature inside the prebaking chamber 43 was kept at the prebaking temperature Tb by means of the temperature sensors 58a and 58b and the first warm air feeder 54a to which warm air is fed through the first warm air feed pipe 55a.

Figure 15:
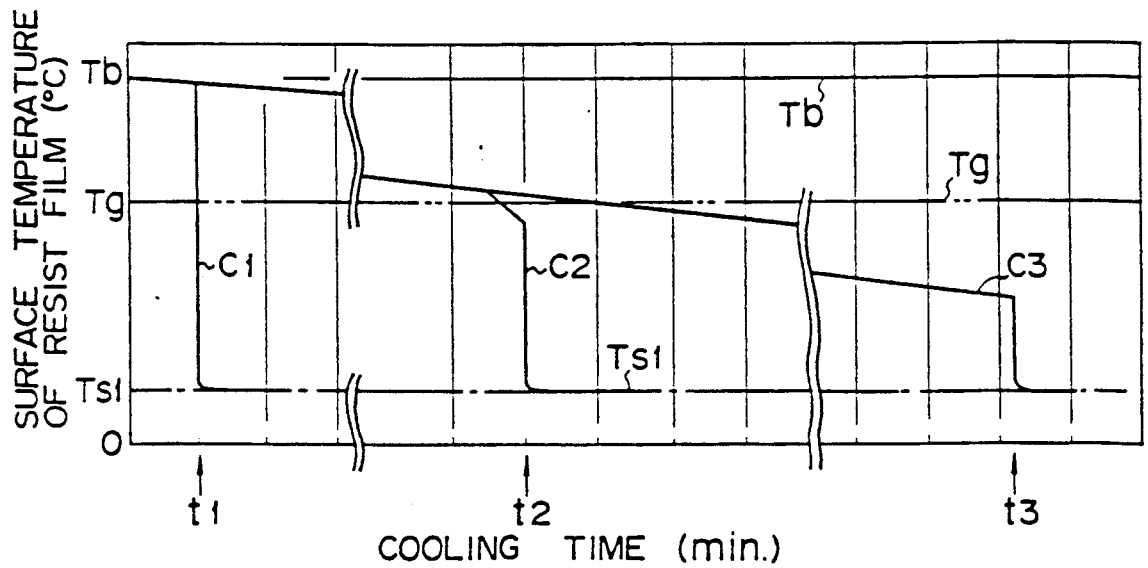
FIG. 15 is a graph showing a temperature change in a substrate during cooling steps of Examples 7 to 9 of the present invention.

The prebaked mask substrate 60 was then conveyed by a conveyor member (not shown) in the first cooling chamber 44a and was set on the support 49. The support 49 was immediately moved downward to dip the substrate in the cooling water 47 at a predetermined temperature $T_{S1}$. In this manner, the substrate 60 was rapidly cooled in a uniform manner. In this case, the first internal shutter 42a was closed, and the first cooling chamber 44a was kept at the temperature $T_{S1}$ of the cooling water 47 by the second warm air feeder 54b and the cooling temperature sensor 59a. The mask substrate 60 was subjected to cooling in accordance with curve $C_1$ of FIG. 15. A time t1 plotted along the abscissa of the graph in FIG. 15 indicates a time at which the mask substrate 60 is dipped in the cooling water 47.

Subsequently, the cooled mask substrate 60 was removed from the cooling water by moving the support 49 upward. The second internal shutter 42b was opened, and the mask substrate 60 was conveyed by a conveyor member (not shown) in the second cooling chamber 44b which was set at the temperature $T_{S1}$ of the cooling water 47 by the third warm air feeder 54c and the temperature sensor 59b. The mask substrate 60 was then set on the vacuum chuck 52 in the second cooling chamber 44b. Subsequently, the second internal shutter 42b was closed, and the vacuum chuck 52 was rotated at a predetermined speed so as to uniformly dry the mask substrate 60 and the resist film formed thereon. In this case, the first internal shutter 42a was opened, and the prebaking chamber 43 and the first cooling chamber 44a were heated to the prebaking temperature Tb, so that the next mask substrate could be prebaked. Thereafter, the cooled and dried mask substrate was conveyed to a conveyor table 53 through the opened outlet port. The resist film was then subjected to exposure, development and rinsing to form a resist pattern on the mask substrate.

EXAMPLE 10

In the same manner as Example 9, a resist film on a mask substrate 60 was prebaked in the prebaking chamber 43. The prebaked substrate 60 was conveyed by a conveyor member (not shown) in the first cooling chamber 44a and was set on the support 49 therein. The first internal shutter 42a was then closed. In this case, the first cooling chamber 44a was kept at the prebaking temperature Tb. Warm air at a temperature $T_{S2}$ higher than the temperature $T_{S1}$ of the cooling water was fed by the second warm air feeder 54b in the first cooling chamber 44a. The mask substrate 60 was thus cooled without being subjected to natural cooling. During this cooling process, the temperature sensor 59a monitored the temperature in the first cooling chamber 44a so as to obtain a given cooling rate for uniformly cooling the entire area of the resist film on the mask substrate 60. When the mask substrate 60 was cooled at a temperature slightly lower than the prebaking temperature Tb, the substrate 60 was cooled by air at a temperature $T_{S3}$ lower than the temperature $T_{S2}$ so as to increase the cooling rate. When the mask substrate 60 was cooled to a predetermined temperature at a given cooling rate, the support 49 was moved downward to dip the mask substrate 60 in the cooling water 47 at the temperature $T_{S1}$ in the cooling vessel 48, thereby uniformly cooling the mask substrate 60. In this case, the first internal shutter 42a was closed, and the first cooling chamber 44a was kept at the temperature $T_{S1}$ by the second warm air feeder 54b and the temperature sensor 59a. The mask substrate 60 was then cooled in accordance with curve $C_2$ of FIG. 15. A time t2 plotted along the abscissa in FIG. 15 indicates a time at which the mask substrate 60 is dipped in the cooling water 47.

The cooled mask substrate 60 was uniformly cooled in the second cooling chamber 44b in the same manner as in Example 8. The mask substrate 60 was conveyed from the second cooling chamber 44b to the conveyor carriage 53 and was subjected to exposure, development and rinsing, thereby forming the resist pattern on the mask substrate.

EXAMPLE 11

A resist pattern on a mask substrate 60 was prebaked in the prebaking chamber 43 in the same manner as in Example 9. The mask substrate 60 was conveyed by a conveyor member (not shown) in the first cooling chamber 44a and was set on the support 49. The first internal shutter 42a was closed. Subsequently, warm air at the temperature $T_{S2}$ higher than the temperature $T_{S1}$ of the cooling water 47 was fed from the second warm air feeder 54b to the first cooling chamber 44a to start cooling the mask substrate 60. During this cooling process, the temperature in the first cooling chamber 44a was monitored by the temperature sensor 59a so as to uniformly cool the entire area of the resist film formed on the mask substrate 60.

When the mask substrate 60 was cooled to a temperature considerably lower than the prebaking temperature Tb, the support 49 was moved downward to be dipped in the cooling water 47 (in the cooling vessel 48) at a temperature $T_{S1}$ so as to uniformly cool the mask substrate 60. In this case, the first internal shutter 42a was closed, and the first cooling chamber 44a was set at the temperature $T_{S1}$ by the second warm air feeder 54b and the temperature sensor 59b. During this cooling process, the mask substrate 60 was cooled in accordance with curve $C_3$ of FIG. 15. A time $t_3$ plotted along the abscissa of FIG. 15 indicates a time at which the mask substrate 60 is dipped in the cooling water 47.

The cooled mask substrate 60 was treated in the same manner as in Example 9 to form a resist pattern on the mask substrate 60.

Figure 16:
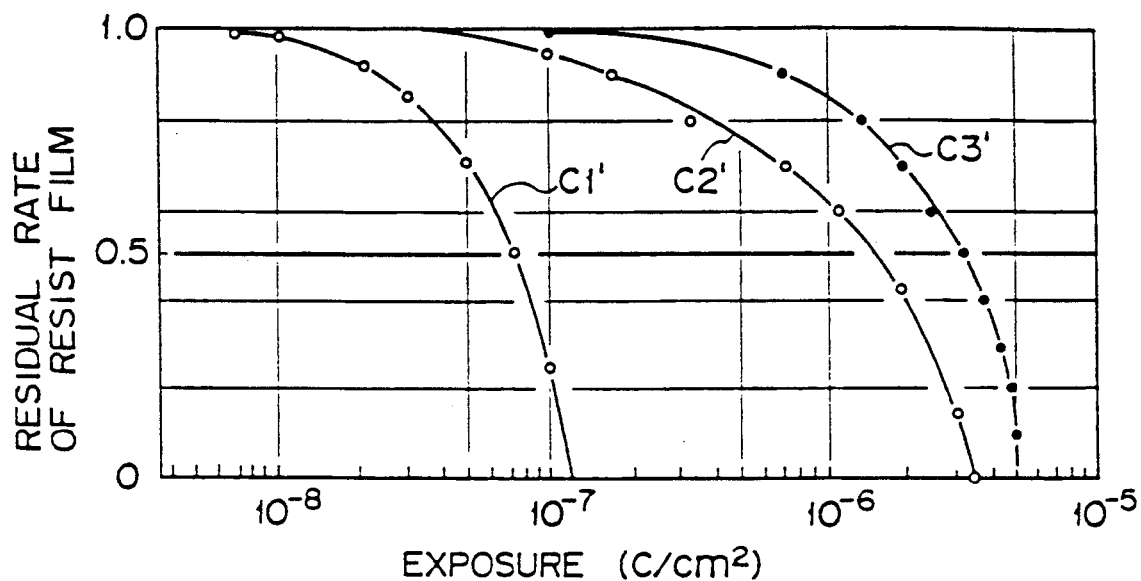
FIG. 16 is a graph showing the relationship between the exposure and the residual rate of the resist film in Examples 7 to 9 of the present invention.

In the formation of the resist patterns in Examples 9 to 11, the residual rates of the resist films as a function of exposure were measured, and test results are shown in FIG. 16. Curve $C_1'$ in FIG. 16 indicates the characteristic curve of the resist film cooled in Example 9; curve $C_2'$ indicates the characteristic curve of the resist film cooled in Example 10; and curve $C_3$ indicates the characteristic curve of the resist film cooled in Example 11.

Conditions
  Resist: electron beam resist ("EBR-9" available from Toray Industries, Inc.) having Tg=133° C.
  Exposure: electron beam at an acceleration voltage of 20 keV
  Development: 10 minutes with a developing solution (MIBK : IPA=7:3; temperature: 25° C.)
  Rinsing: 30 seconds with IPA rinsing solution (temperature: 25° C.)
  Cooling: Tb=200° C. and $T_{S1}$=25° C.

As is apparent from FIG. 16, the same resist material and the same process except for cooling allow selection of sensitivity within a wide range.

When the resist patterns of Examples 9 to 11 were formed under the following conditions such as a resist material and exposure, an electron beam sensitivity could be varied within the range of 8 $\mu c/cm^2$ to 2 $\mu c/cm^2$.

Conditions:
  Resist: electron beam resist (PMMA) having Tg=110° C.
  Exposure: electron beam at an acceleration voltage of 20 keV
  Development: 13 minutes with an MIBK developing solution (temperature: 25° C.)
  Rinsing: 30 seconds with IAA rinsing solution (temperature: 25° C.)
  Cooling: Tb=170° C. and $T_{S1}$=25° C.

The sensitivity distributions within the surfaces of the resist patterns on the mask substrates 60 of Examples 9 to 11 after cooling were measured, and were proved to be uniform. This is because the prebaking chamber 43 and the first cooling chamber 44a are partitioned by the first internal shutter 42a, so that the substrate is properly cooled under cooling rate control without being subjected to natural cooling.

When the process in Example 9 was repeated for a plurality of resist films to measure the resist sensitivities after cooling, all the resist films were controlled to have the same sensitivity.

According to Examples 9 to 11, the sensitivity of the resist film can be stabilized over the entire area of a single mask substrate and between mask substrates. Therefore, the subsequent exposure, development and rising processes can be performed to form highly precise resist patterns with good reproducibility. These patterns do not vary in accordance with the product lots. Furthermore, a wide sensitivity selection range can be provided to easily satisfy the sensitivity conditions of the exposure apparatus and any other process by using the same resist. As a result, highly precise resist patterns can be manufactured in a mass production line.

In Examples 9 to 11, cooling was performed by monitoring the temperatures in the cooling chambers. However, when the sequence conditions such as flow rate of air and time are predetermined, the temperatures need not be monitored. In this case, the temperature sensors can be omitted.

In Examples 9 to 11, the dipping method is used as the cooling means. However, the cooling means shown in FIGS. 11 to 13 can be used.

The prebaking-cooling process and its apparatus can be applied without modification to second baking-cooling process after exposure.

Figure 17:
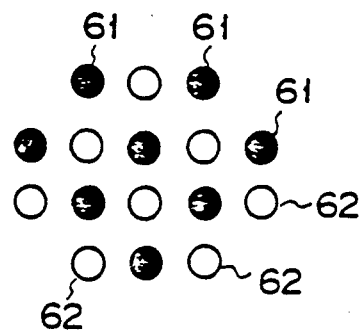
FIG. 17 shows a baking-cooling means used in the present invention.

In the above examples, baking and cooling were performed in separate locations. However, by using a Pertier effect element, baking and cooling can be performed on the same plate. Furthermore, as shown in FIG. 17, by arranging a plurality of pipes 61 for spraying a hot gas and a plurality of pipes 62 for spraying a cold gas in a matrix form, baking and cooling can be performed in the same position.

In addition to this modification, a cooling chamber may be built into an electron beam exposure apparatus to perform exposure immediately after cooling.

What is claimed is:
1. A method for forming a lithographic processed resist pattern for a semiconductor device, comprising the steps of:
  applying a resist material selected from the group consisting of a photoresist material, a far ultraviolet sensitive material, an electron beam sensitive resist material, an X-ray sensitive resist material and an ion beam sensitive material to a rigid substrate to form a resist film thereon;
  baking said resist film;
  cooling said resist film, said cooling being controlled with a cooling means such that an entire area of said resist film is kept at a uniform temperature, said cooling means being a dipping means for dipping said substrate in a cooling liquid;

selectively irradiating a surface of said resist film with at least one member selected from the group consisting of electron beams, light rays, X-rays and ion beams; and developing said resist film to form a resist pattern.

2. A method according to claim 1, wherein said cooling is performed at a cooling rate of 0.8° C./sec or more.

3. A method according to claim 1, wherein said baking is performed at or above the glass transition temperature of said resist.

4. A method for forming a lithographic processed resist pattern for a semiconductor device, comprsiing the steps of:

applying a resist material selected from the group consisting of a photoresist material, a far ultraviolet sensitive material, an electron beam sensitive resist material, an X-ray sensitive resist material and an ion beam sensitive material to a substrate to form a resist film thereon;

prebaking said resist film formed on said substrate;

cooling said resist film;

selectively irradiating a surface of said resist film with at least one member selected from the group consisting of electron beams, light rays, X-rays and ion beams;

baking said resist film;

cooling said resist film in a controlled manner with a cooling means such that an entire area of said resist film is kept at a uniform temperature, said cooling means being a dipping means for dipping said substrate in a cooling liquid; and developing said resist film to form a resist pattern on said substrate.

5. A method according to claim 4, wherein said cooling is performed at a cooling rate of 0.8° C./sec or more.

6. A method according to claim 4, wherein said baking is performed at or above the glass transition temperature of said resist.

* * * * *